(12) United States Patent
Zha et al.

(10) Patent No.: US 11,962,926 B2
(45) Date of Patent: Apr. 16, 2024

(54) IMAGE SENSOR WITH CONFIGURABLE PIXEL CIRCUIT AND METHOD

(71) Applicants: Beijing RuisiZhixin Technology Co., Ltd., Beijing (CN); Alpsentek GmbH, Zurich (CH)

(72) Inventors: Yingyun Zha, Regensdorf (CH); Jian Deng, Zurich (CH); Roger Mark Bostock, Munsingen (CH)

(73) Assignee: Alpsentek GmbH, Zurich (CH)

( * ) Notice: Subject to any disclaimer, the term of this patent is extended or adjusted under 35 U.S.C. 154(b) by 0 days.

(21) Appl. No.: 18/002,775

(22) PCT Filed: Aug. 4, 2021

(86) PCT No.: PCT/EP2021/071773
§ 371 (c)(1),
(2) Date: Dec. 21, 2022

(87) PCT Pub. No.: WO2022/033936
PCT Pub. Date: Feb. 17, 2022

(65) Prior Publication Data
US 2023/0247325 A1    Aug. 3, 2023

(30) Foreign Application Priority Data
Aug. 14, 2020 (EP) ..................... 20191068

(51) Int. Cl.
*H04N 25/77* (2023.01)
*H01L 27/146* (2006.01)
(Continued)

(52) U.S. Cl.
CPC ....... *H04N 25/77* (2023.01); *H01L 27/14612* (2013.01); *H04N 25/573* (2023.01); *H04N 25/766* (2023.01)

(58) Field of Classification Search
CPC .... H04N 25/573; H04N 25/766; H04N 25/77; H01L 27/14612
See application file for complete search history.

(56) References Cited

U.S. PATENT DOCUMENTS

| 7,728,269 B2 | 6/2010 | Lichtsteiner et al. |
| 9,961,291 B2 | 5/2018 | Chen |

(Continued)

FOREIGN PATENT DOCUMENTS

| EP | 2933995 A1 | 10/2015 |
| EP | 3313064 A1 | 4/2018 |

(Continued)

OTHER PUBLICATIONS

N. Tu et al., "CMOS active pixel sensor with combined linear and logarithmic mode operation", Proc. IEEE Canadian Conf. Electrical and Computer Engineering, 1998, pp. 754-757.

(Continued)

*Primary Examiner* — Kevin K Pyo
(74) *Attorney, Agent, or Firm* — Simpson & Simpson, PLLC

(57) ABSTRACT

The present disclosure relates to an image sensor comprising a plurality of pixel circuits each comprising a photodiode connected between ground and a floating diffusion (FD) node, a reset transistor (MRST) connected between a first voltage supply and the floating diffusion (FD) node, and a source follower transistor (MSF), wherein its drain is connected to a second voltage supply, the gate is connected to a floating diffusion (FD) node and the source is connected to a row select transistor (MSEL). The row select transistor (MSEL) is connected between the source of the source follower transistor (MSF) and a common column output. Each pixel circuit is configured to output an output signal corresponding to a light incident on the photodiode. Each pixel circuit includes at least one additional transistor for (Continued)

configuring each pixel circuit to selectively output a linear integration signal or a logarithmic signal.

22 Claims, 8 Drawing Sheets

(51) Int. Cl.
  *H04N 25/571* (2023.01)
  *H04N 25/766* (2023.01)

(56) References Cited

U.S. PATENT DOCUMENTS

| | | | |
|---|---|---|---|
| 10,218,922 | B2 | 2/2019 | Kondo et al. |
| 10,721,423 | B2 | 7/2020 | Finateu et al. |
| 11,202,041 | B2 | 12/2021 | Kindo |
| 2008/0303928 | A1* | 12/2008 | Kusuda ............... H04N 25/671 348/300 |
| 2010/0182468 | A1 | 6/2010 | Posch et al. |
| 2011/0169990 | A1 | 7/2011 | Higuchi et al. |
| 2011/0291019 | A1 | 12/2011 | Yuan et al. |
| 2015/0035949 | A1 | 2/2015 | Rouh et al. |
| 2015/0358570 | A1 | 12/2015 | Taniguchi |
| 2016/0093273 | A1 | 3/2016 | Wang et al. |
| 2016/0094787 | A1 | 3/2016 | Govil et al. |
| 2016/0094800 | A1 | 3/2016 | Gousev et al. |
| 2016/0227135 | A1 | 8/2016 | Matolin et al. |
| 2018/0191972 | A1 | 7/2018 | Berner et al. |
| 2018/0191982 | A1 | 7/2018 | Berner et al. |
| 2019/0051680 | A1 | 2/2019 | Hanzawa et al. |
| 2019/0260384 | A1 | 8/2019 | Liobe et al. |
| 2019/0285468 | A1 | 9/2019 | Berkovich et al. |
| 2019/0340452 | A1 | 11/2019 | Asayama et al. |
| 2020/0014418 | A1 | 1/2020 | Yu et al. |
| 2020/0068149 | A1 | 2/2020 | Finateu et al. |
| 2020/0084403 | A1 | 3/2020 | Suh et al. |
| 2022/0303490 | A1 | 9/2022 | Chen |

FOREIGN PATENT DOCUMENTS

| | | | |
|---|---|---|---|
| EP | 3930312 | A1 | 12/2021 |
| FR | 2976918 | A1 | 12/2012 |
| JP | 8-122149 | A | 5/1996 |
| JP | 2009508085 | A | 12/2006 |
| JP | 2010-510732 | A | 4/2010 |
| JP | 2012015923 | A | 1/2012 |
| JP | 2015-501936 | A | 1/2015 |
| JP | 2015170863 | A | 9/2015 |
| JP | 2016-533140 | A | 10/2016 |
| JP | 2018067776 | A | 4/2018 |
| JP | 2019536389 | A | 12/2019 |
| JP | 2020016654 | A | 1/2020 |
| KR | 2020/0029328 | A | 3/2020 |
| WO | 2014/174498 | A1 | 10/2014 |
| WO | 2015/036592 | A1 | 3/2015 |
| WO | 2017/009944 | A1 | 1/2017 |
| WO | 2017/158483 | A1 | 9/2017 |
| WO | 2017150240 | A1 | 9/2017 |
| WO | 2017/174579 | A1 | 10/2017 |
| WO | 2018/122800 | A1 | 7/2018 |
| WO | 2020/080383 | A1 | 4/2020 |
| WO | 2020110537 | A1 | 6/2020 |
| WO | 2020/229980 | A1 | 11/2020 |
| WO | 2020/0229981 | A1 | 11/2020 |
| WO | 2021/017766 | A1 | 2/2021 |
| WO | 2021260102 | A1 | 12/2021 |
| WO | 2021260105 | A1 | 12/2021 |
| WO | 2021260106 | A1 | 12/2021 |
| WO | 2021260116 | A1 | 12/2021 |
| WO | 2021260122 | A1 | 12/2021 |

OTHER PUBLICATIONS

J. Guo et al., 2008, Sensors, 2008 IEEE.
Lichtsteiner et al., 2008, IEEE Journal of Solid-State Circuits, vol. 43, No. 2, Feb. 2008.
Chou et al., 2012, Sensors, 2012 IEEE.
S.D. Freedman, 2015, 2nd International Conference on Knowledge-Based Engineering and Innovation (KBEI).
M. Goto et al., 2016, 2016 IEEE SOI-3D-Subthreshold Microelectronics Technology Unified Conference.
Tobi Delbruck "Frame-Free Dynamic Digital Vision" Proceedings of the International Conf. on Secure-Life Electronics, Advanced Electroncis for Quality Life and Society, Mar. 7, 2008, pp. 21-26.
Christian Reckleben, Karsten Hansen, Senior Member, IEEE, Pradeep Kalavakuru, Janusz Szymanski, Florian Erdinger, Peter Fischer, Manfred Kirchgessner, and Jan Soldat; A 64-by-64 Pixel-ADC Matrix; 2015 IEEE.
Suarez et al. 2010; In-Pixel ADC for a Vision Architecture on CMOS-3D Technology.
Yu M. Chi, Student Member, IEEE, Udayan Mallik, Matthew A. Clapp, Edward Choi, Gert Cauwenberghs, Senior Member, IEEE, and Ralph Etienne-Cummings, Member, IEEE; IEEE Journal of Solid-State Circuits, vol. 42, No. 10, Oct. 2007; CMOS Camera With In-Pixel Temporal Change Detection and ADC.
Itoh et al., "4-Layer 3-D IC with a function of parallel signal processing", Microelectronic engineering, vol. 15, No. 1-4, 1991, pp. 187-190.
Christian Brandli, StudentMember, IEEE, Raphael Berner, Member, IEEE, MinhaoYang, Student Member, IEEE, Shih-Chii Liu, Senior Member, IEEE, and Tobi Delbruck, Fellow, IEEE; A 240 × 180 130 dB 3 μs Latency Global Shutter Spatiotemporal Vision Sensor; IEEE Journal of Solid-State Circuits, vol. 49, No. 10, Oct. 2014.
Gallego et al.: "Event-based Vision: A Survey", IEEE Transactions on Pattern Analysis and Machine Intelligence, 2020, arXiv:1904.08405v3.
Biyin et al., "An In-Pixel Gain Amplifier Based Event-Driven Physical Unclonalbe Function for CMOS Dynamic" 2019 IEEE International Symposium on Circuits and Systems (ISCAS), IEEE, May 26, 2019, pp. 1-5.
Background Subtraction: Theory and Practice, Ahmed Elgammal, ISBN 1627054405; Copyright 2015.

* cited by examiner

IMAGE SENSOR WITH CONFIGURABLE PIXEL CIRCUIT AND METHOD

REFERENCE TO RELATED APPLICATION

This application is a U.S. National Stage filing of International Application PCT/EP2021/071773, titled "IMAGE SENSOR WITH CONFIGURABLE PIXEL CIRCUIT AND METHOD," filed Aug. 4, 2021, which claims benefit of priority of European Patent Application Number 20191068.4, by Yingyun Zha et. al., filed on Aug. 14, 2020, each of which is hereby incorporated by reference herein in its entirety.

The present invention relates to an image sensor integrated circuit comprising a plurality of pixel circuits and a respective method.

An APS (APS: active pixel sensor) is an image sensor integrated circuit comprising a plurality of pixels typically arranged in rows and columns. Each pixel includes a photodetector, typically a pinned photodiode, and one or more MOSFET amplifiers (MOSFET: metal oxide semiconductor field effect transistor). CMOS APSs (CMOS: complementary metal oxide semiconductor) are widely used in cell phone cameras, web cameras, pocket cameras, DSLR cameras (DSLR: digital single lens reflex), mirrorless interchangeable lens cameras, etc.

APSs include linear APSs and logarithmic APSs. A linear APS has good sensitivity at low illumination intensity, but the dynamic range is limited by the full well capacity, which defines the amount of charge a pixel can hold before saturating. A logarithmic APS has a good response in high illumination and therefore a high dynamic range, but the sensitivity in low illumination intensity is poor. Different approaches have been taken to combine a linear response in low light illumination and logarithmic response in high illumination.

Silicon foundries provide image pixel cells with highly optimised process technology and highly optimised layout to create high quality and dense frame image data (standard APS cells). This operation is sub-optimal, however, for low latency event-based processing. A standard reconfiguration is known which provides a logarithmic output, but this configuration has disadvantages in performance and does not readily provide a signal for pixel local low latency event processing (pixel parallel).

The foundry standard cells are not designed for the logarithmic local output and an electrical configuration which provides good performance in this logarithmic configuration while retaining good performance in the linear configuration and allowing electrical switching between the configurations is not evident.

CMOS image sensor (CMOS: Complementary Metal Oxide Silicon) are produced in high volume in CIS (CIS: CMOS image sensor) foundry processes which are optimised for high performance (low dark current, low noise, high quantum efficiency). The CIS process is optimised with particular 3T (3T: three transistor) or 4T (4T: four transistor) cells for linear integrating response and may be extended for additional functions such as global shutter operation.

It is an object of the invention to provide an image sensor comprising an improved pixel circuit and a respective method providing high quality, in particular low noise at low illumination intensity image data frames as well as high dynamic range and low noise continuous data for event generation from the same pixel array.

This object is achieved with the subject-matter of the independent claims. Advantageous embodiments are defined in the dependent claims.

According to the invention, a limited set of additional non-critical switch transistors has been found which enables the reuse of the foundry standard linear integration APS cell to additionally provide a high quality continuous logarithmic output local to the pixel.

There are compatible extensions of the invention which allow further outputs (frame logarithmic output, pixel-local linear output etc.) which add further function at the cost of additional surface area and/or power consumption.

This invention thus provides an extension of the standard APS cell with an electrical reconfiguration for a high performance logarithmic pixel local low latency output.

The invention does add pixel circuit surface area (cost and/or reduced pixel density) and is therefore preferably applicable for circuits requiring the high quality logarithmic output but also for simple extensions to the dynamic image sensor range. The additional area is minimal and provides an efficient realisation of the function, including significant reuse of transistors in the standard APS structure.

This invention discloses the addition of further transistors to the optimised foundry structure to selectably provide a logarithmic pixel-local output available continuously. The logarithmic output extends the range of operation of the cell to brighter illumination conditions. The pixel-local output is suitable for low-latency event-based response to changing illumination conditions.

The addition of the further transistors as disclosed in this invention is compatible with the standard structure devices and their dimensions and does not impair the function of the standard structure linear integration.

Linear and logarithmic APS have been proposed separately. This invention discloses a structure in which these modes are combined with the reuse of the same photodiode and optimised read-out electronics as well as the pixel-local provision of a continuous pixel-local logarithmic output suitable for providing low-latency event-based response.

The present invention relates to an image sensor comprising a plurality of pixel circuits each comprising a photodiode connected between ground and a floating diffusion (FD) node, a reset transistor (MRST) being configured to be connected between a first voltage supply (vrst) and the floating diffusion (FD) node, and a source follower transistor (MSF), wherein its drain is configured to be connected to a second voltage supply (vdd), its gate is connected to the floating diffusion (FD) node and its source is connected to a row select transistor (MSEL). The drain of the row select transistor (MSEL) is connected between the source of the source follower transistor (MSF) and a common column output. Each pixel circuit is configured to output an output signal corresponding to a light incident on the photodiode. Each pixel circuit includes at least one additional transistor (MS2, MS3, MS4 and MVB) for configuring each pixel circuit to selectively output a linear integration signal or a logarithmic signal.

Various embodiments may preferably implement the following features:

Each pixel circuit preferably further comprises a transfer gate transistor (MTX) connected between the photodiode and the FD node.

Each pixel circuit may be configured to generate a logarithmic output signal (vlg out) and further comprise a first additional bias transistor (MVB) connected between the second voltage supply (vdd) and the drain of the source follower transistor (MSF). A second additional transistor (MS2) may connect the drain of the bias transistor (MVB) to the drain of the reset transistor (MRST), and a third additional transistor (MS3) may connect the drain of the reset transistor (MRST) to the first power supply (vrst).

Preferably the third additional transistor (MS3) is open. A fourth additional transistor (MS4) may connect the drain and gate of the reset transistor (MRST). The row select transistor (MSEL) may be closed and the column output may be connected to ground. Each pixel circuit preferably comprises an output (vlg_out) connected between the drain of the bias transistor (MVB) and the drain of the source follower transistor (MSF).

Preferably, each pixel circuit is configured to generate a logarithmic output signal and further comprises a fourth additional switch transistor (MS4) connecting the drain and gate of the reset transistor (MRST), a first additional bias transistor (MVB) connected between the second voltage supply (vdd) and the source follower transistor (MSF), and a third additional transistor (MS3) connecting the reset transistor (MRST) to the first power supply (vrst). Each pixel circuit preferably further comprises a second additional transistor (MS2) connecting the bias transistor (MVB) to the reset transistor (MRST). Preferably the second additional transistor (MS2) is open, and preferably the row select transistor (MSEL) is closed and the logarithmic output is made available on the column output. In other words, the logarithmic output can be read from the column output.

According to an aspect of the present invention an image sensor comprises a plurality of pixel circuits each comprising: a photodiode connected between ground and a floating diffusion (FD) node, a reset transistor (MRST) configured to be connected between a first voltage supply and the floating diffusion (FD) node, a source follower transistor (MSF), wherein its drain is configured to be connected to a second voltage supply, its gate is connected to the floating diffusion (FD) node and its source is connected to a row select transistor (MSEL), and the row select transistor (MSEL) is connected between the source of the source follower transistor (MSF) and a common column output, wherein each pixel circuit is configured to output an output signal corresponding to a light incident on the photodiode. Each pixel circuit includes at least one additional transistor for configuring each pixel circuit to selectively output a linear integration signal or a logarithmic signal. Each pixel circuit further comprises a first additional bias transistor (MVB) connected between the second voltage supply and the drain of the source follower transistor (MSF), and a second additional transistor (MS2) configured to connect the drain of the bias transistor (MVB) to the drain of the reset transistor (MRST), and a third additional transistor (MS3) configured to connect the reset transistor (MRST) to the first power supply, and a fourth additional transistor (MS4) configured to connect the drain to the gate of the reset transistor (MRST). Each pixel circuit when being configured to generate a logarithmic output signal the second additional transistor (MS2) is connecting the drain of the bias transistor (MVB) to the drain of the reset transistor (MRST), and the third additional transistor (MS3) is open, and the fourth additional transistor (MS4) is connecting the drain and gate of the reset transistor (MRST), wherein the row select transistor (MSEL) is closed and the column output is connected to ground, and wherein each pixel circuit comprises an output (vlg_out) connected between the bias transistor (MVB) and the source follower transistor (MSF).

According to an aspect of the present invention an image sensor comprises a plurality of pixel circuits each comprising: a photodiode connected between ground and a floating diffusion (FD) node, a reset transistor (MRST) configured to be connected between a first voltage supply and the floating diffusion (FD) node, a source follower transistor (MSF), wherein its drain is configured to be connected to a second voltage supply, its gate is connected to the floating diffusion (FD) node and its source is connected to a row select transistor (MSEL), and the row select transistor (MSEL) is connected between the source of the source follower transistor (MSF) and a common column output. Each pixel circuit is configured to output an output signal corresponding to a light incident on the photodiode. Each pixel circuit includes at least one additional transistor for configuring each pixel circuit to selectively output a linear integration signal or a logarithmic signal. Each pixel circuit further comprises a bias transistor (MVB) connected between the second voltage supply and the drain of the source follower transistor (MSF), a second additional transistor (MS2) configured to connect the drain of the bias transistor (MVB) to the drain of the reset transistor (MRST), and a third additional transistor (MS3) configured to connect the reset transistor (MRST) to the first power supply, and a fourth additional switch transistor (MS4) configured to connect the drain and the gate of the reset transistor (MRST). Each pixel circuit when being configured to generate a logarithmic output signal the fourth additional switch transistor (MS4) is connecting the drain and gate of the reset transistor (MRST), the third additional transistor (MS3) is connecting the reset transistor (MRST) to the first power supply, and wherein the second additional transistor (MS2) is open and the row select transistor (MSEL) is closed and the logarithmic output is made available on the column output.

Preferably, at least one additional diode connected transistor is connected in series with the second additional transistor (MS2) and configured to multiply the gain in a logarithmic conversion configuration, or at least one additional diode connected transistor is connected in parallel with the third additional transistor (MS3) and configured to multiply the gain in a logarithmic conversion configuration.

Preferably, during distinct time intervals, the at least one transistor is configured to configure the plurality of pixel circuits sequentially in alternate configurations.

Preferably the at least one transistor is configured to configure the alternate configurations independently for each of the plurality of pixel circuits, or for sub-sets of the plurality of pixel circuits, or the at least one transistor is configured to configure the alternate configurations independently for each of the plurality of pixel circuits or for sub-sets of the plurality of pixel circuits based on a previous output signal.

A combined linear logarithmic integration configuration may be implemented as an additional configuration. During the integration phase, optional transistor MTX is closed (ON), MS3 is closed (ON) and the gate of MRST is connected to a common control voltage via the supply of gate X1. The circuit output is from the source of MSF via transistor MSEL.

The image sensor may be constructed of multiple semiconductor layers, where each layer is optimised for the function of that level.

Preferably, the image sensor is constructed of multiple semiconductor layers, wherein a second layer contains at least the at least one additional transistor, and a first layer comprises the photodiode and the remaining transistors.

Additional reconfiguration switches may connect respective floating diffusion nodes (FD) between a sub-set of adjacent pixels.

This may increase the gain from the illumination intensity to the output at the cost of reduced resolution. The configuration may be electrically reconfigured from time to time in operation and may optionally depend on the operating mode or on the illumination conditions.

A quasi continuous pixel-local output may be created by repeated short linear integration times. A further transistor MVC may be added with its source connected to ground, its gate connected to a reference voltage vc and its drain connected to the source of MSF. MVC provides a local current sink and a pixel-local output, vln_out, is available at the drain of MVC. MVC may also be referred to as a bias transistor.

A high quality logarithmic frame output may additionally be made available in an electrical reconfiguration.

In one embodiment, each pixel circuit may further comprise a row select transistor (MSEL2) connected between the drain of MSF and the column output, and a fifth additional transistor (MS5) connecting the source of the source follower transistor (MSF) to ground.

Preferably, each pixel circuit further comprises a second source follower transistor (MSF2) and a row select transistor (MSEL2) wherein the gate of MSF2 is connected to the drain of MSF, its drain is connected to the second voltage (vdd) and its source is connected to the drain of the row select transistor (MSEL2) and the source of the row select transistor is connected to the column output, and a fifth additional transistor (MS5) connecting the source of the source follower transistor (MSF) to ground.

Each pixel circuit may further comprise a second source follower transistor (MSF2) and a row select transistor (MSEL2) wherein the gate of MSF2 is connected to the drain of MSF, its drain is connected to the second voltage (vdd) and its source is connected to the drain of the row select transistor (MSEL2) and the source of the row select transistor is connected to an additional column output.

In summary, a high quality logarithmic frame output may additionally be made available in an electrical reconfiguration. In one embodiment, the voltage, vlg_out, is connected via an additional row select transistor (MSEL2) to the column line and the source of MSF is switched to ground with additional switch MS5. In a further embodiment, the voltage, vlg_out, is connected via a second source follower (MSF2) and row select transistor (MSEL2) to the existing column line and the source of MSF is switched to ground with additional switch MS5. In a further embodiment, the voltage, vlg_out, is connected via a second source follower (MSF2) and row select (MSEL2) to an additional column line.

The invention further encompasses corresponding methods.

The invention is described with reference to the following figures.

Figure 2:
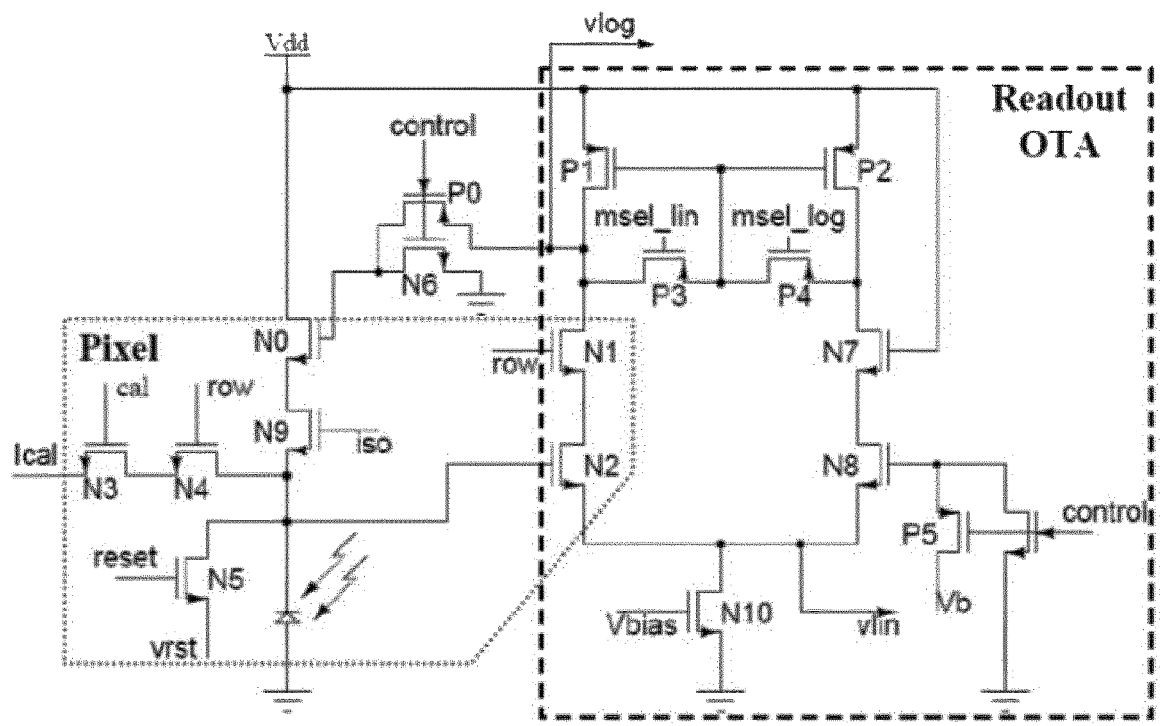
Figure 3:
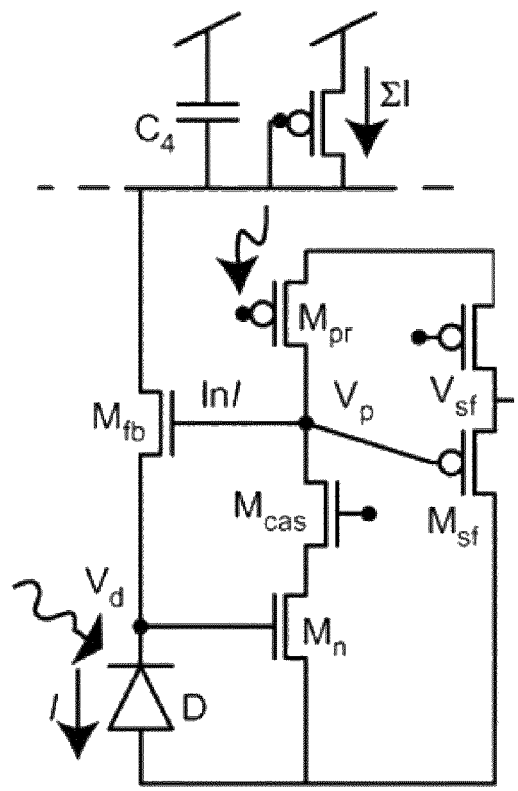
Figure 4:
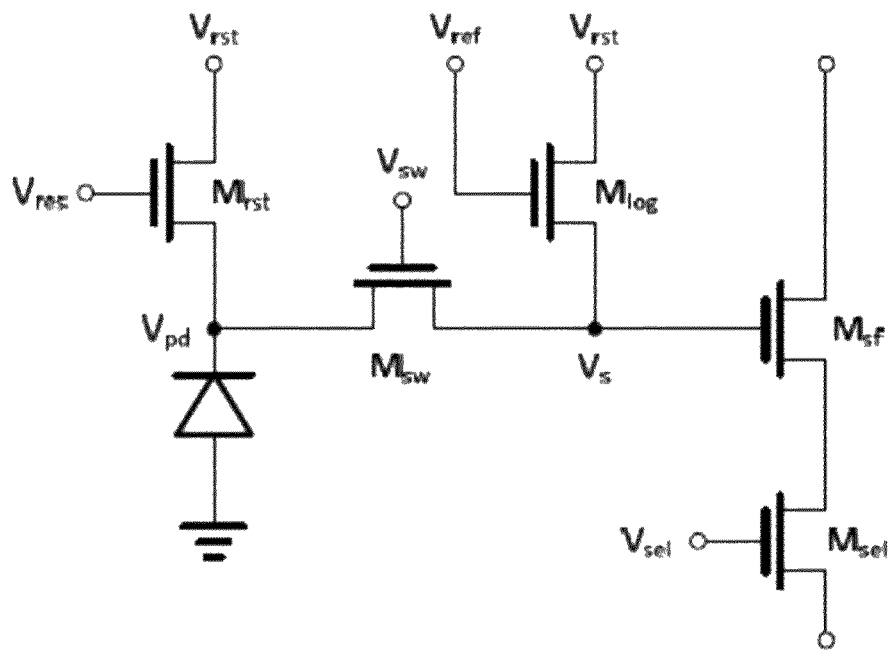
Figure 5:
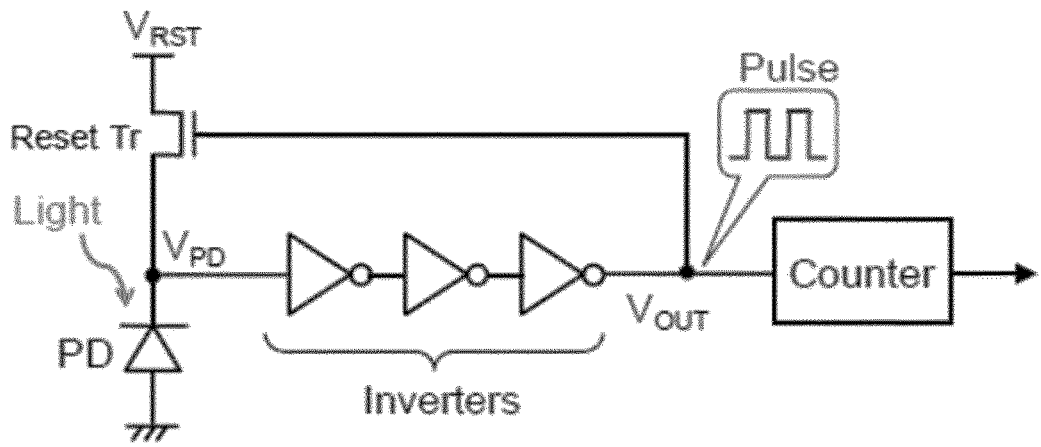
Figure 6:
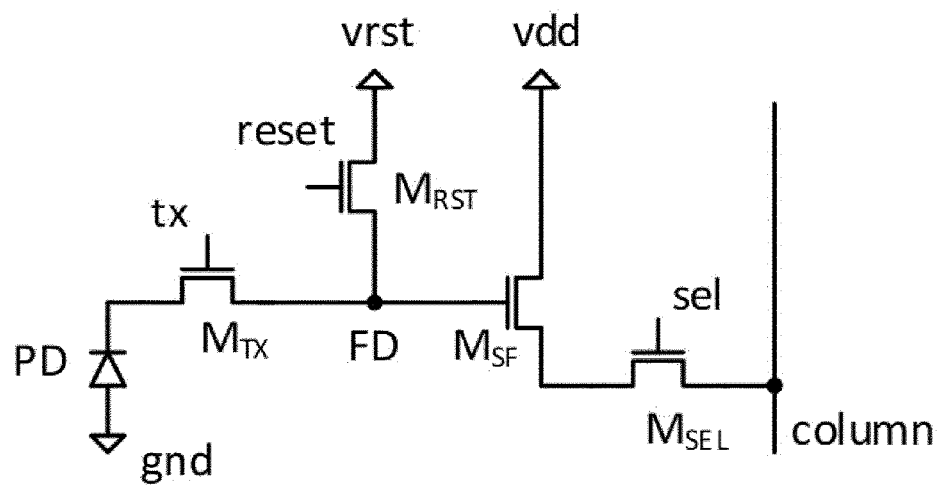
Figure 7A:
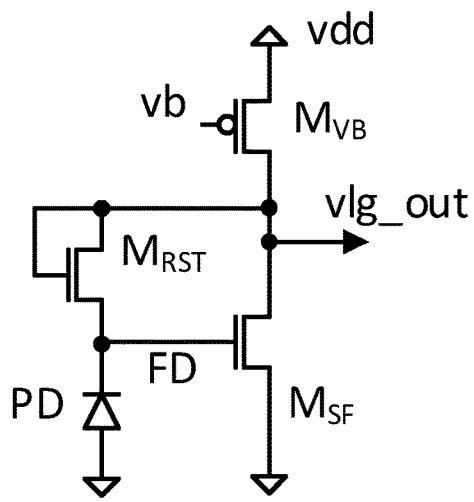
Figure 7B:
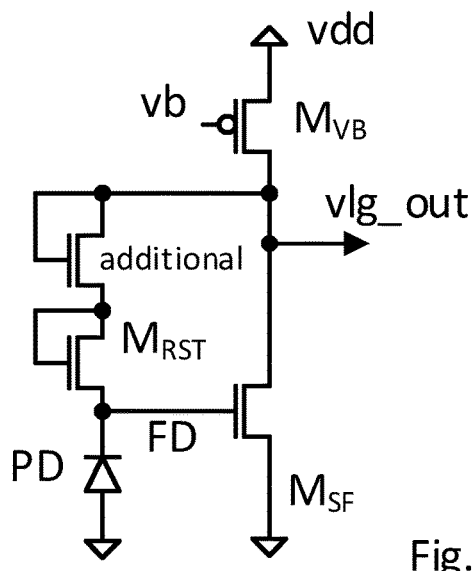
Figure 8A:
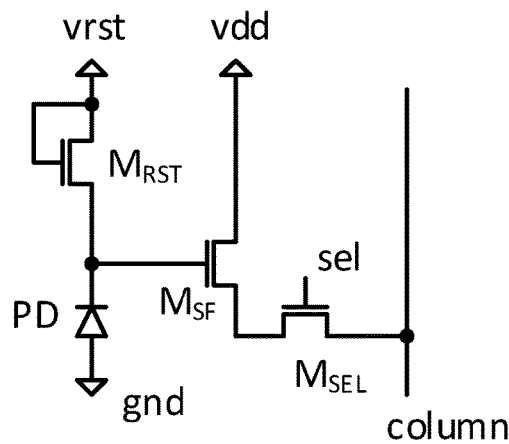
Figure 8B:
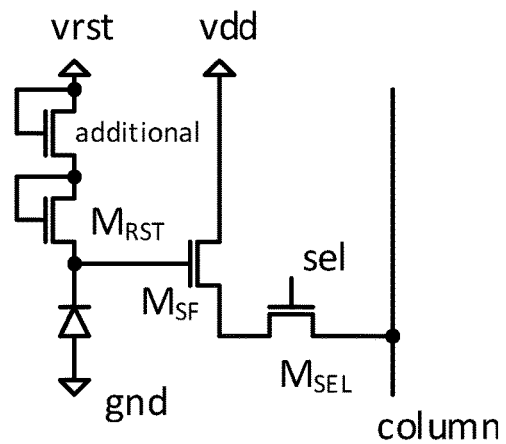
Figure 8C:
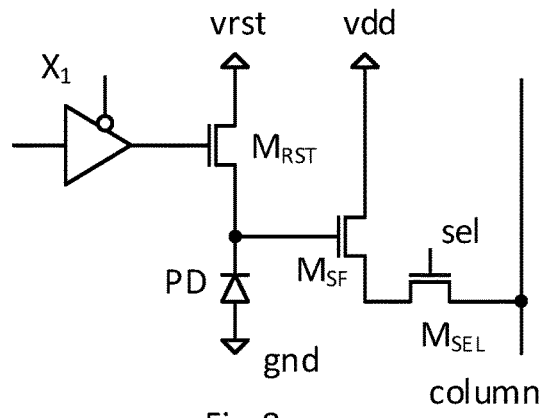
Figure 9:
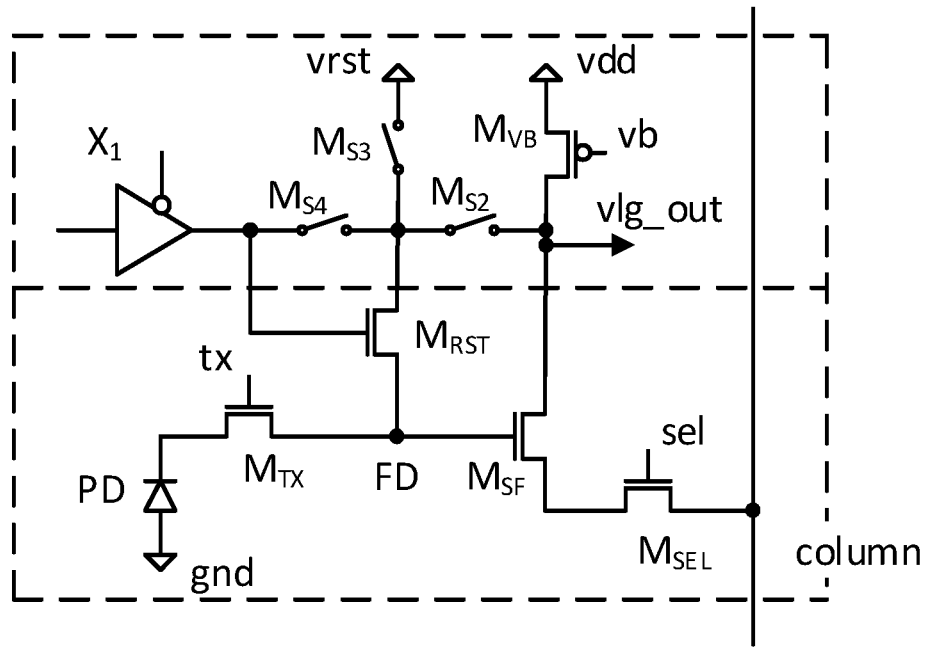
Figure 9A:
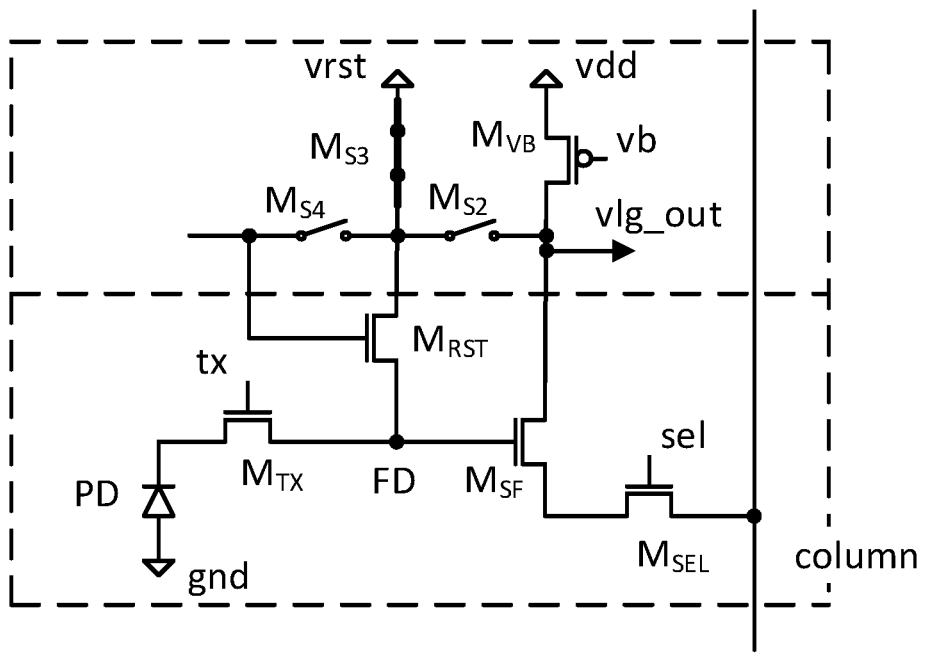
Figure 9B:
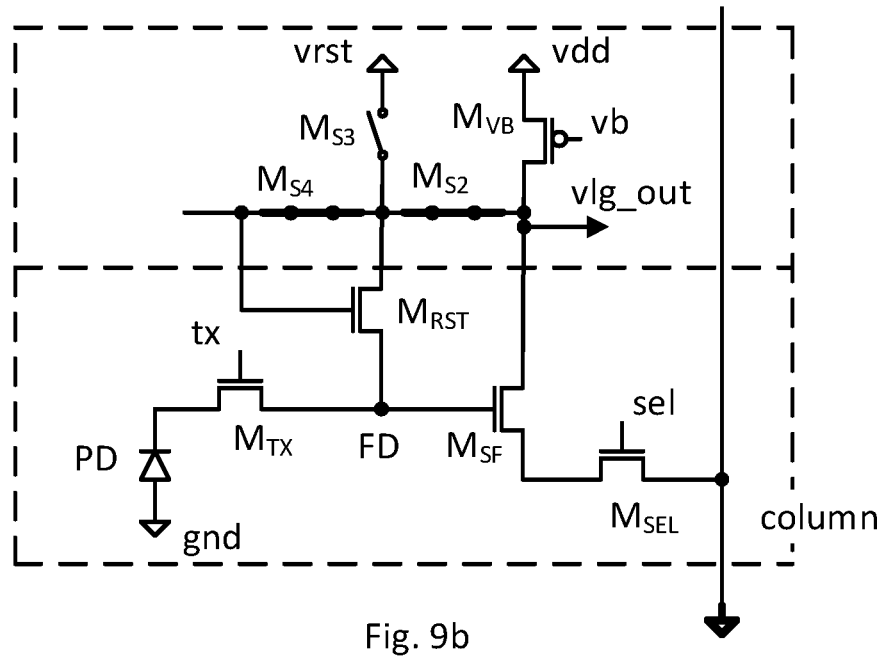
Figure 9C:
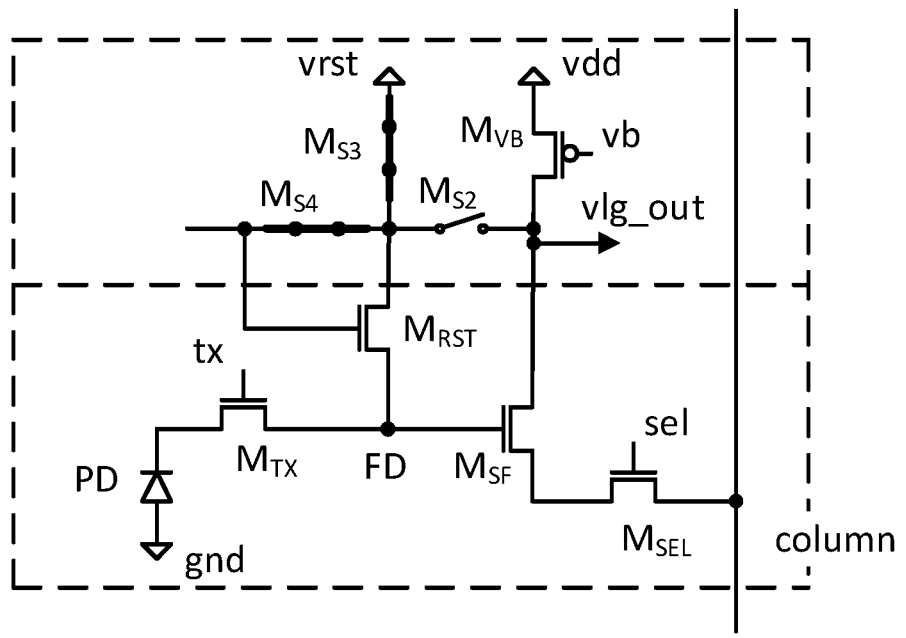

FIG. 2 shows a reconfigurable linear and logarithmic output circuit according to the prior art, FIG. 3 shows a logarithmic output circuit according to the prior art, FIG. 4 shows a combined linear and logarithmic circuit according to the prior art, FIG. 5 shows a circuit with a counting approach according to the prior art, FIG. 6 shows a linear 4T image sensor according to the prior art, FIGS. 7a and 7b show a logarithmic circuit according to an embodiment of the present disclosure, FIGS. 8a to 8c show a logarithmic circuit according to an embodiment of the present disclosure, FIGS. 9 shows a circuit according to an embodiment of the present disclosure, FIGS. 9a, 9b and 9c show the circuit of FIG. 9 and configurations corresponding to a linear integration mode, a first logarithmic mode and an alternative logarithmic mode, respectively FIGS. 10 to 13 show circuits according to various embodiments of the present disclosure.

The same reference signs in the figures denote the same or similar elements. If not indicated otherwise, the figures may also show the same circuitry in the same or similar elements or parts of the respective figures. As the switching functionality described below may be realised by transistors, the terms switch and transistor may be used interchangeably.

Figure 1A:
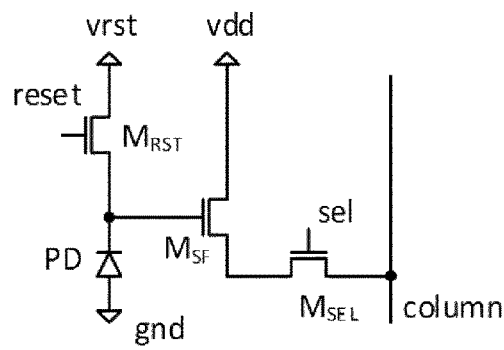
FIG. 1a shows a linear 3T image sensor circuit according to the prior art.
Figure 1B:
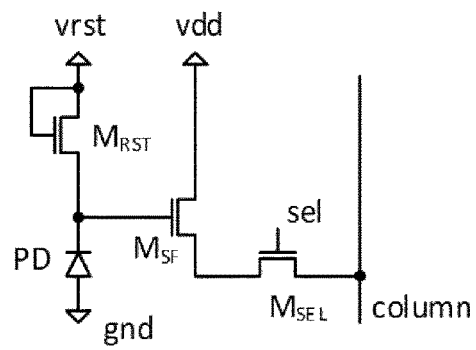
FIG. 1b shows a logarithmic image sensor circuit according to the prior art.

FIGS. 1a and 1b illustrate schematically a pixel of a classic Lin-Log image sensor (Lin-Log: linear-logarithmic) in a 3T pixel example (3T: three transistor) disclosed in N. Tu et al., "CMOS active pixel sensor with combined linear and logarithmic mode operation", Proc. IEEE Canadian Conf. Electrical and Computer Engineering, 1998, pp. 754-757. In the linear integration mode illustrated in FIG. 1a, the pixel is reset by turning on the reset transistor, MRST. After switching off the reset transistor, MRST, and after a certain integration time, the charge on the photodiode is read out through an amplifier comprising an in-pixel source follower, MSF, by switching on the select row transistor, MSEL. The read-out transistor, MSF, is configured as a source follower and acts as a buffer allowing the pixel voltage to be observed without removing the accumulated charge. Its power supply, vdd, is typically the same as the power supply of the reset transistor, vrst. The read-out output voltage drop from the reset value is proportional to the light intensity and the integration time.

In the logarithmic mode illustrated in FIG. 1b, the gate of the reset transistor, MRST, is connected to supply voltage, vrst, and operates in the weak inversion region. In this region, the drain source voltage drop across the transistor has a logarithmic relationship to the current, which is set by the photodiode. The voltage across the transistor is transferred to the output via source follower MSF and select transistor, MSEL, as in linear mode.

FIG. 6 shows a 4T pixel, which comprises the same elements as the 3T pixel, but adds a transfer gate MTX between a floating diffusion node FD and the photodiode PD. Closing the reset transistor, MRST, and transfer gate MTX resets the floating diffusion node FD and photodiode potential to the voltage vrst which may correspond to the supply voltage vdd, clearing all integrated charge. Since the reset transistor is n-type, this operation is a soft reset and the final potential is a threshold voltage below vrst.

Charge integration is carried out with MTX off, and the charge is transferred to the floating diffusion (FD) node by turning on MTX following the integration time. The source follower MSF and select transistor, MSEL, again select a single row of the pixel array to be read by the read-out electronics.

Other configurations of the pixels such as 5T and 6T pixels also exist. By adding extra transistors, functions such as global shutter, as opposed to the more common rolling shutter, are possible.

The logarithmic mode illustrated in FIG. 1b, has disadvantages as (i) the signal is referred to the power supply (ii)

the logarithmic output is presented on the column line and is not directly available for local processing.

Alternative logarithmic configurations are known, which provide an improved response. J. Guo et al., 2008, SENSORS, 2008 IEEE, provides electrical reconfiguration between linear and logarithmic modes, but without a pixel-local output. This is shown in FIG. 2. P. Lichtsteiner et al., 2008, IEEE JOURNAL OF SOLID-STATE CIRCUITS, VOL. 43, NO. 2, FEBRUARY 2008, provides a pixel-local output, but no capacity for reconfiguration between linear and logarithmic configurations as depicted in FIG. 3.

Configurations exist, see FIG. 4, W. Chou et. al., 2012, SENSORS, 2012 IEEE, which provide a combined linear logarithmic response without reconfiguration, with a linear response under low illumination intensity conditions and a logarithmic response under high illumination intensities. These image sensors provide a high dynamic range response, but do not provide a continuous pixel-local output for low-latency event-based sensing.

Alternative solutions are reported with multiple exposure times, S. D. Freedman, 2015, 2nd International Conference on Knowledge-Based Engineering and Innovation (KBEI), and time based conversion methods, e.g. according to FIG. 5, M. Goto et al., 2016, 2016 IEEE SOI-3D-Subthreshold Microelectronics Technology Unified Conference (S3S), which provide a logarithmic light response and extend the dynamic range of the image sensor. These configurations are not suitable to provide a continuous pixel-local output for low-latency event-based sensing.

FIG. 6 schematically illustrates a pixel concept circuit configuration of the image sensor in accordance with the 4T configuration. This mode provides the linear integrating mode, where transistors MRST, MSF, MSEL and MTX are used in their standard function. This configuration can be used for both global and rolling shutter modes. MTX may be omitted to operate as the 3T circuit.

Some foundry standard cells provide additional functions, for example additional gain ranges, which are implemented with additional transistors creating a 5T, 6T, . . . nT structure. The invention is compatible with these extensions of the standard cell.

The operation of the pixel in this configuration consists of four phases. (i) In the FD reset phase, signal reset is high and the transistor MRST is on. The FD node is connected to vrst and any integrated charge of the previous cycle is drained. (ii) In the PD charge accumulation phase, MTX is off and the photo-generated carriers accumulate in the PD when light is incident. (iii) In the PD charge transfer phase, MTX is on and the accumulated charge is transferred from PD to FD and converted to a voltage. (iv) In the FD voltage readout phase, MSEL is activated and the transferred charge is held on FD. The FD voltage is read out to the column line via buffer source follower transistor, MSF, when signal sel is high.

FIG. 7a schematically illustrates a pixel circuit configuration of an image sensor in accordance with the present invention, which enables a logarithmic mode, wherein readout occurs on the vlg_out output. MRST, MSF and MSEL are reused components of the 4T circuit described above. A photodiode, PD is connected between ground and node FD. The gate of a source follower transistor, MSF, is connected to the node FD, its drain is connected to an output line, vlg_out, and its source is connected to ground. The source of a bias transistor MVB is connected to output line vlg_out, its gate is connected to a bias voltage vb and its drain is connected to a supply voltage vdd. Transistor MRST is connected as a diode connected transistor with its drain to output line vlg_out and with its source to node FD.

The current $I_{PD}$ through transistor MRST is given by the current flowing through photodiode PD. MRST operates in weak inversion with the current to voltage relationship given by:

$$I_{PD} \approx I_{D0} e^{(vlg\_out - V_{FD} - V_{TH})/nU_T}$$

Thus, signal vlg_out is a logarithmic function of $I_{PD}$ plus a constant offset given by the biasing:

$$vlg\_out \approx nU_T \ln(I_{PD}/I_{D0}) + V_{FD} + V_{TH}$$

where $I_{D0}$ is the $I_{PD}$ current when $vlg\_out - V_{FD} = V_{TH}$ for the MSF transistor, n is the slope factor, $U_T$ is the thermal voltage and $V_{TH}$ is the threshold voltage of MRST. Therefore, the current $I_{PD}$ through transistor MRST is converted to a well-defined output voltage on output line vlg_out.

With respect to the logarithmic mode shown in FIG. 1b, this mode is advantageous as it includes a feedback amplification loop, in particular with the following advantages:
- a pixel-local output signal suitable for continuous operation and low-latency event response generation
- reduced noise
- improved driving speed of the output, especially with low photodiode current
- improved independence of the load and noise on the output
- fixed bias voltage for the photodiode giving constant operating conditions
- immunity to supply coupled noise With respect to the logarithmic mode shown in FIG. 3, this mode is advantageous as it provides:
- a reduced drain source voltage across transistor MRST, suppressing drain source and drain bulk leakage in this transistor, which is reused from the standard 4T structure.
- a transistor configuration which can be obtained with a set of standard additional switches.

The logarithmic mode shown in FIG. 3 may be implemented by alternate connection of switch MS4 between the drain of transistor MSF to the gate of transistor MRST.

Further diode connected transistors may optionally be added in series with transistor MRST in the concept circuit. These transistors operate in the same manner and provide a multiplication of the voltage gain. These transistors are not a reuse of the foundry standard cell and represent additional cost (area) but are compatible with the invention.

Preferably, at least one additional diode connected transistor is connected in series with the second additional transistor (MS2) and configured to multiply the gain in a logarithmic conversion configuration, or at least one additional diode connected transistor is connected in parallel with the third additional transistor (MS3) and configured to multiply the gain in a logarithmic conversion configuration. This is shown in FIG. 7b.

FIG. 8a schematically illustrates a further pixel circuit configuration of the image sensor in accordance with the present invention which can be reached when reconfiguring the pixel circuit. The third pixel configuration provides an alternative logarithmic mode equivalent to the mode reported in the prior art, see also FIG. 1b. In this mode, the photo current is flowing through the transistor MRST and readout of the floating diffusion node FD occurs by closing the select row transistor MSEL. The photodiode PD is connected between ground and the floating diffusion node FD. The source follower transistor MSF is connected with its gate to the floating diffusion node FD, with its drain to the supply voltage vdd and with its source to the select row transistor MSEL. The gate and drain of the transistor MRST are connected to the log supply voltage vrst and its source is connected to the floating diffusion node FD.

This alternative logarithmic mode is enabled with the current invention with no additional transistors in the pixel circuit. It may also be advantageous in some embodiments to extend the dynamic range for frame image operation with no additional cost, i.e. silicon area.

The alternative logarithmic configuration can be combined with the linear integrating configuration as shown in FIG. 8c. The operation of the pixel in this combined log-lin case consists of three phases. (i) In the FD reset phase, transistor MRST is on. The FD node is connected to vrst and any integrated charge of the previous cycle is drained. (ii) In the PD charge accumulation phase, the photo-generated carriers accumulate on node FD and are converted to a voltage. The gate of MRST is connected to a lower control voltage via the lowered supply of gate X1 as shown in FIG. 8c. Where the FD voltage is discharged by the photodiode current to a sufficiently low voltage, MRST starts to conduct (iv). In the FD voltage readout phase, MRST is switched off, MSEL is activated and the transferred charge is held on FD. The FD voltage is read out to the column line via MSF when signal sel is high.

The response of the circuit at low light illumination intensities is linear as MRST is not conducting and the FD voltage change is proportional to the illumination intensity and the integration time. At high illumination intensity MRST provides a logarithmic voltage response and the FD voltage is a logarithmic function of the intensity.

This configuration is well known and is compatible with the current invention. It is advantageous as it provides additional dynamic range for frame image data. The linear response is degraded as the isolation provided by the foundry standard transfer transistor, MTX, is not used.

As in the first logarithmic mode described above, further diode connected transistors may be added in series with transistor MRST in the concept circuit of the alternative configuration.

These transistors operate in the same manner and provide a multiplication of the voltage gain. These transistors are not a reuse of the foundry standard cell and represent additional cost (area), but are compatible with the invention.

The pixel circuit illustrated in FIG. 9 enables a first pixel configuration having a first linear integrating mode in accordance with FIG. 6, a second pixel configuration having an optimised integrating mode in accordance with FIG. 7a, and a third pixel configuration having an alternative logarithmic mode in accordance with FIG. 8a.

The core is the 4T pixel of FIG. 6 and is shown inside the lower dashed box in the figure. The photodiode, PD, and transistors MRST, MSF and MSEL are part of the 4T cell. The upper dashed box shows additional circuitry which is used to provide the reconfiguration of the pixel, consisting of four transistors (MS2, MS3, MS4, MVB) and one logic gate, X1.

The photodiode PD is connected via a transmitting transistor MTX to the floating diffusion node FD.

The transistor MRST is connected between the floating diffusion node FD and a second switch MS3, which is further connected to a supply voltage, vrst. The gate of MRST is connected to the output of tristate logic gate X1. The operation of X1, MRST and MS3 provides the reset path for node FD.

Switch MS4 further connects the gate and drain of transistor MRST. This connection is used to allow the reuse of transistor MRST as the transistor converting from a linear photo-current to a logarithmic voltage in the logarithmic modes.

The gate of transistor MSF is connected to the floating diffusion node, FD, the source to the selection switch transistor MSEL and the drain to the drain of transistor MVB, which in turn connects to power supply, vdd. Transistor MSF creates the source follower circuit to copy the voltage on node FD to the column line in configurations where this function is used.

The source of transistor MVB is connected to supply vdd, the drain to output node vlg_out and the gate to signal vb. This transistor is used as a switch (on) in configurations where a source follower function of MSF is required and as a current source where an output on vlg_out is required.

Switch MS2 is connected between the drain of transistor MRST and vlg_out and is closed in the first logarithmic mode.

The reconfigurable circuit provides a high quality (low noise at low light) image data frame output as well as high dynamic range and low noise continuous data for event generation from the same pixel array.

The reuse of the foundry provided 4T cell is advantageous as:
  these cells are provided in area optimised form, including process technology optimisations to optimise the area
  these cells are provided in performance optimised form, including process technology optimisations to optimise the performance
  characterisation information is available for these cells
  reliability information is available for these cells
  yield information is available for these cells
  foundries have a commitment to maintain the performance specifications of the cell across technology changes
  the migration of designs from one process node to the next is facilitated by the availability of the characterisation information.

In linear integration mode (cf. FIG. 6) MS2, MS4 and MS5 are open, while MS3, and MVB are closed. MRST is used as a reset transistor and MTX, MSF and MSEL have their usual function during linear operation. The effective circuit matches FIG. 6. FIG. 9a shows the circuit of FIG. 9, and illustrates the linear integration mode, wherein MS2 and MS4 are in the open position and MS3 is in the closed position.

In the first logarithmic mode (cf. FIG. 7a), MS3 is open, X1 is inactive, and MS2, MS4 and MTX are closed. The bias voltage vb is connected to a configurable bias voltage. Transistor MSEL is shorted by connecting control signal sel to the supply voltage vdd and the column line is connected to ground. The effective circuit matches the concept circuit of FIG. 7a. The photocurrent IPD passing through MTX and MRST is therefore continuously converted to an output voltage, vlg_out, giving a logarithmic response. FIG. 9b shows the circuit of FIG. 9, and illustrates the first logarithmic mode, wherein MS2 and MS4 are in the closed position and MS3 is in the open position.

In one embodiment, the voltage vlg_out is used locally for in-pixel processing. In a further embodiment, the voltage, vlg_out, is connected via an additional row select transistor (MSEL2) to the column line and the source of MSF is switched to ground with additional switch MS5. In a further embodiment, the voltage, vlg_out, is connected via a second source follower (MSF2) and row select transistor (MSEL2) to the existing column line and the source of MSF is switched to ground with additional switch MS5. In a further embodiment, the voltage, vlg_out, is connected via a second source follower (MSF2) and row select (MSEL2) to an additional column line.

In the alternative logarithmic mode, MS2 is open, X1 is inactive, while MS3, MS4, MTX and MVB are closed. MSEL is used as a row select and, when the row is selected, the logarithmic voltage is continuously available on the column line. The effective circuit in this configuration matches FIG. 1b. This configuration mode is compatible with pixel evaluation on the existing column line without additional transistors. FIG. 9c shows the circuit of FIG. 9, and illustrates the alternative logarithmic mode, wherein MS3 and MS4 are in the closed position and MS2 is in the open position.

The image sensor may electrically reconfigure the entire pixel arrangement between alternate configurations from time to time. This is advantageous to provide different data qualities from the same image sensor, e.g. high quality low light frame image data and also low-latency dynamic response.

The image sensor may also electrically reconfigure different areas (sub-sets of pixels) in different configurations at the same time, where the sub-set may change from time to time. This is advantageous to obtain different qualities of data simultaneously from different regions of an image.

The image sensor may switch the configuration of the entire pixel arrangement or sub-sets of the pixel arrangement based on the image output over a preceding time interval. This is advantageous to provide high quality data under changing illumination conditions.

In a further embodiment additional reconfiguration switches connect equivalent FD nodes between a sub-set of adjacent pixels is a logarithmic configuration where a single read-out MRST transistor enabled. In this way, multiple photodiodes are connected in parallel, increasing the total photodiode current through the active MRST transistor and resulting in a larger voltage and more gain from the illumination intensity to the output voltage. This is advantageous as it improves the signal to noise ratio and improves the response speed.

Figure 10:
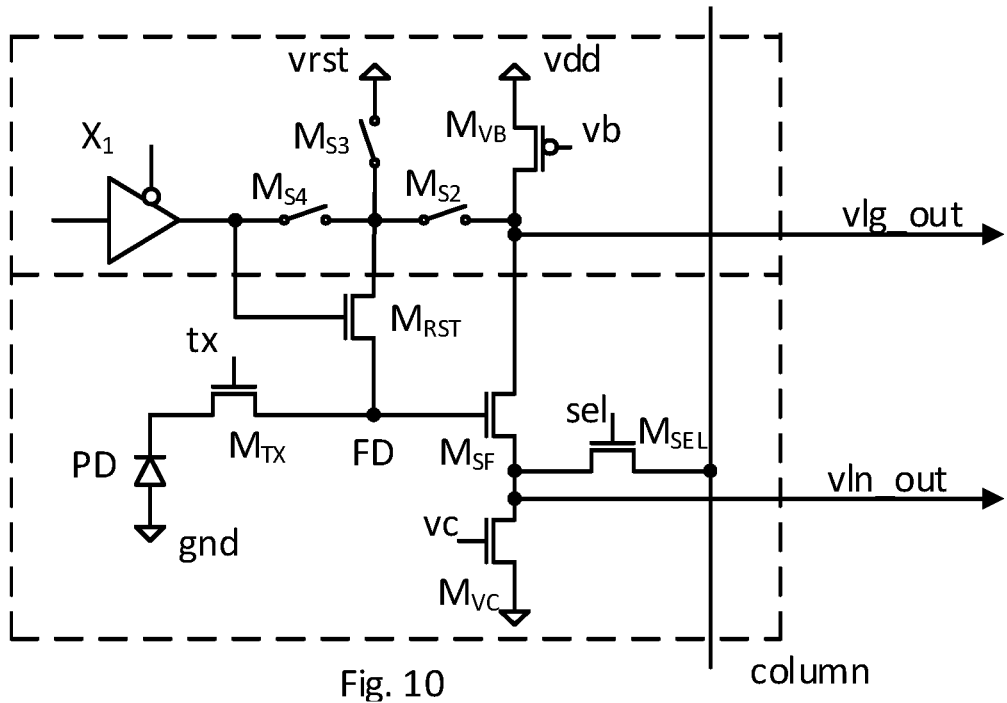

In a further embodiment shown in FIG. 10, a quasi continuous pixel-local output is created based on the linear integration configuration by implementing repeated short linear integration times. Further transistor MVC is added with its source connected to ground, gate to reference voltage vc and drain to the source of MSF. MVC provides a local current sink and the pixel-local output is available at the drain of MVC.

This embodiment is advantageous as it reduces the noise in operation of the pixel-local continuous processing at lower illumination intensities. In combination with the logarithmic processing at higher light levels, this provides an extended dynamic range for local processing and low latency response.

The speed of response is reduced in this operation (increased latency), but the speed is still higher than full frame output.

Figure 11:
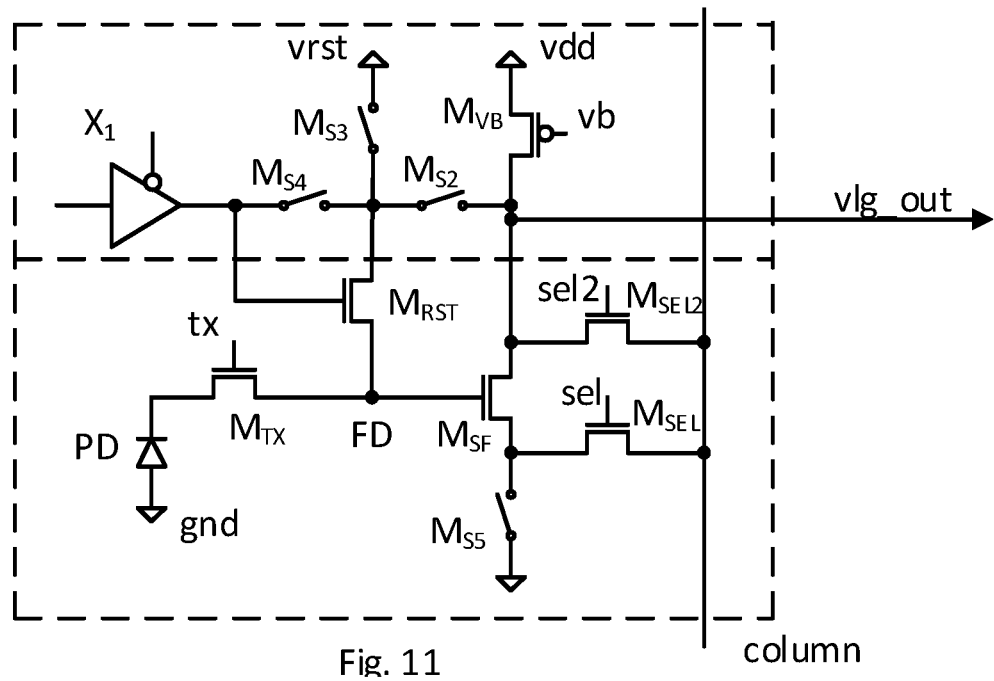
Figure 12:
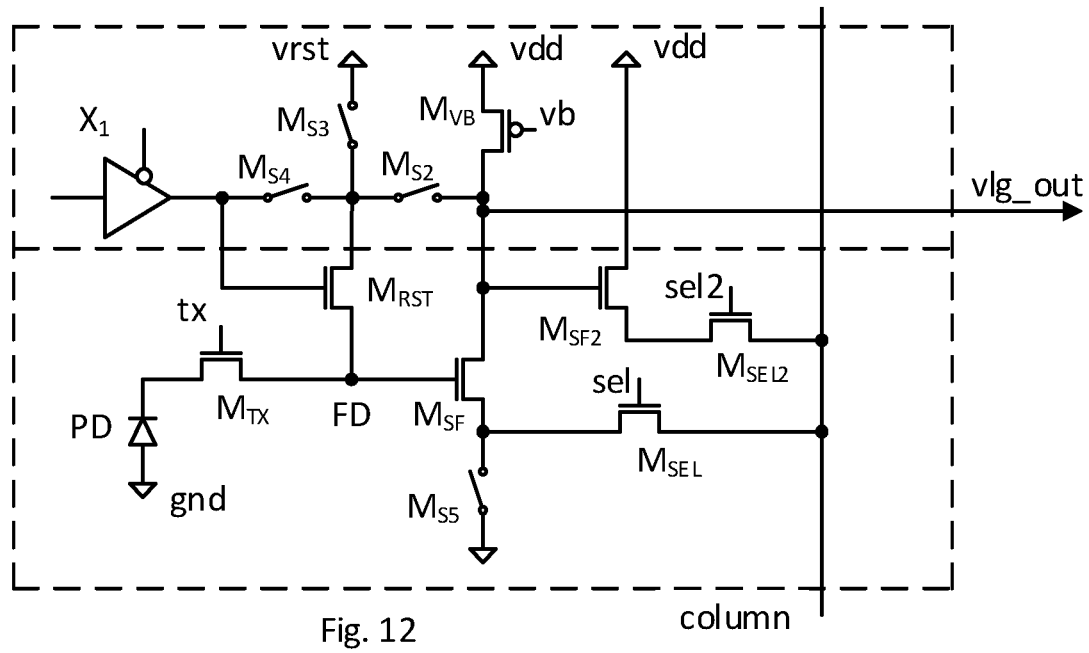
Figure 13:
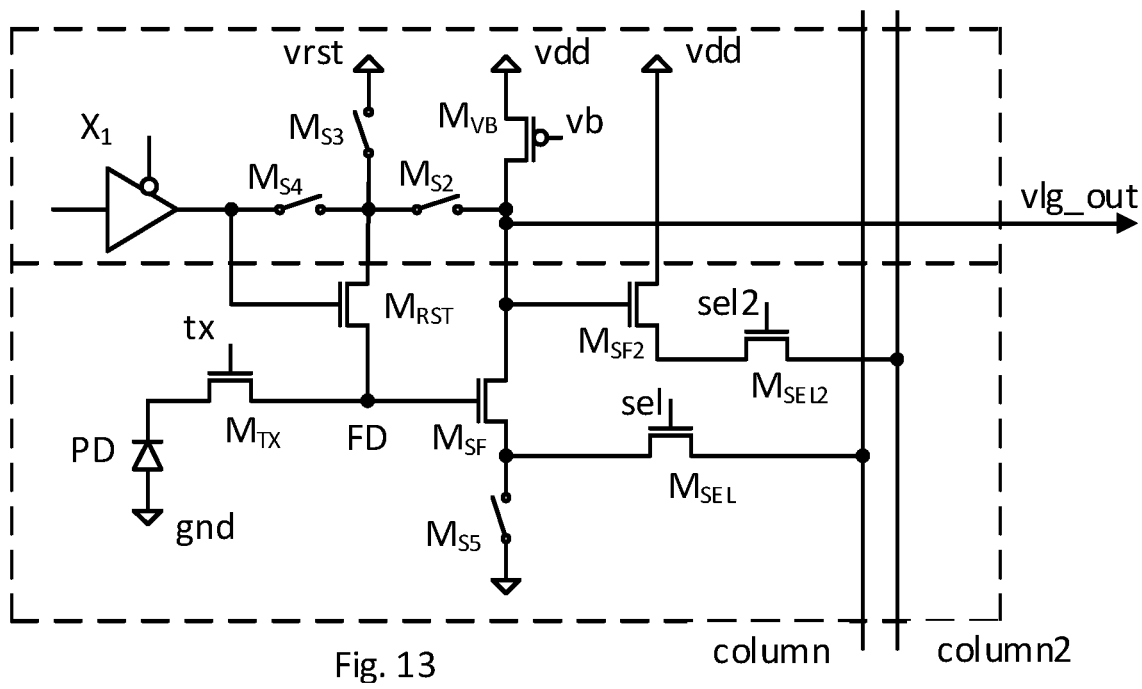

According to a further configuration depicted in FIGS. 11 to 13, a high quality logarithmic frame output is additionally made available in an electrical reconfiguration. In one example shown in FIG. 11, the voltage, vlg_out, is connected via an additional row select transistor (MSEL2) to the column line and the source of MSF is switched to ground with additional switch MS5. In a further example according to FIG. 12, the voltage, vlg_out, is connected via a second source follower (MSF2) and row select transistor (MSEL2) to the existing column line and the source of MSF is switched to ground with additional switch MS5. In a further embodiment, the voltage, vlg_out, is connected via a second source follower (MSF2) and row select (MSEL2) to an additional column line.

In one embodiment, the image sensor integrated circuit is constructed of a single semiconductor layer.

In a further embodiment the image sensor is constructed of multiple semiconductor layers, where the semiconductor process type of each layers is optimised for the function of that layer.

This implementation is advantageous as the optimisation for function of the semiconductor processes allows (i) improvements in performance, (ii) reduction of silicon area and following (ii), a reduction in device size and device cost. The altered physical structure improves the optical performance for (i) fill factor (ii) quantum efficiency and reduces electrical disturbance between controlling signal lines and the photosensor circuit.

In particular the foundry standard base cell may be implemented on one semiconductor layer, where this semiconductor layer is optimised for the optical performance and the cell density and fill factor. The additional switching transistors are realised in an additional semiconductor layer.

The proposed structure provides reconfiguration with a limited number of connections between semiconductor layers per pixel. In one embodiment and with reference to FIG. 9, three connections are required per pixel to implement all described configurations.

In conclusion, the linear integration mode is used for high sensitivity at low light levels and frame mode operation, as in a classical 4T pixel. The dynamic range can be extended for frame mode operation using the alternative logarithmic mode at no extra cost (area) or using the first logarithmic mode for improved performance at additional cost (area).

The first logarithmic mode provides a high quality continuous output signal for pixel local processing suitable for generating event responses.

The operating modes are obtained by electrical reconfiguration with a small overhead to the foundry standard 3T or 4T circuit providing both high quality frame image data and a continuous pixel-local high quality logarithmic response for event processing from the same pixel array.

The use of the same array for the linear and logarithmic operating modes is advantageous as:
  the geographical correlation of the frame image data and the event data is simple as the same pixels are used. Precise and time-stable and vibration-stable alignment or calibration of multiple image systems (optics) or compensation of optical aberrations and distortions or chromatic responses is not required.
  the requirement for a second image sensor is removed in some embodiments, reducing camera volume, power consumption and cost and improving reliability.

The plurality of pixels is typically organised in a two dimensional grid with "rows" and "columns". It should be noted that the definition of "rows" and "columns" can be interchanged without affecting the invention. It should also be noted that other geometrical configurations are possible which map to a two dimensional grid, without impacting the applicability of the invention.

The configurations according to the embodiments described above may be electrically reconfigured from time to time in operation and may optionally depend on the operating mode or on the illumination conditions.

Other aspects, features, and advantages will be apparent from the summary above, as well as from the description, including the figures and the claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

Furthermore, in the claims the word "comprising" does not exclude other elements or steps, and the indefinite article "a" or "an" does not exclude a plurality. A single unit may fulfil the functions of several features recited in the claims. The terms "essentially", "about", "approximately" and the like in connection with an attribute or a value particularly also define exactly the attribute or exactly the value, respectively. Any reference signs in the claims should not be construed as limiting the scope.

The invention claimed is:

1. An image sensor comprising a plurality of pixel circuits each comprising:
    a photodiode connected between ground and a floating diffusion (FD) node,
    a reset transistor (MRST) configured to be connected between a first voltage supply and the floating diffusion (FD) node,
    a source follower transistor (MSF), wherein a drain of the source follower transistor (MSF) is connected to a second voltage supply, a gate of the source follower transistor (MSF) is connected to the floating diffusion (FD) node and a source of the source follower transistor (MSF) is connected to a row select transistor (MSEL), and
    the row select transistor (MSEL) is connected between the source of the source follower transistor (MSF) and a common column output,
    wherein each pixel circuit is configured to provide an output signal corresponding to a light incident on the photodiode; and
    wherein, to configure each pixel circuit to selectively output a linear integration signal or a logarithmic signal, each pixel circuit further comprises:
        a first additional bias transistor (MVB) connected between the second voltage supply and the drain of the source follower transistor (MSF), and
        a second additional transistor (MS2) configured to connect a drain of the bias transistor (MVB) to a drain of the reset transistor (MRST), and
        a third additional transistor (MS3) configured to connect the reset transistor (MRST) to the first voltage supply, and
        a fourth additional transistor (MS4) configured to connect the drain of the reset transistor (MRST) to a gate of the reset transistor (MRST).

2. The image sensor of claim 1, wherein each pixel circuit further comprises a transfer gate transistor (MTX) connected between the photodiode and the FD node.

3. The image sensor of claim 1, wherein the image sensor is constructed of multiple semiconductor layers, where each layer is optimised for a function of that layer.

4. The image sensor of claim 1, wherein the image sensor is constructed of multiple semiconductor layers, wherein a second layer of the multiple layers contains the additional transistors (MVB, MS2, MS3, MS4) and a first layer of the multiple layers comprises the photodiodes, the reset transistors (MRST), the source follower transistors (MSF), and the row select transistors (MSEL).

5. The image sensor of claim 1, further comprising reconfiguration switches that connect floating diffusion nodes (FD) of a sub-set of adjacent ones of the plurality of pixels circuits.

6. The image sensor of claim 1, wherein each pixel circuit further comprises a bias transistor (MVC) and an output transistor, wherein the bias transistor (MVC) is connected between ground and the source follower transistor (MSF) and a voltage (vc) is connected to a gate of the output transistor.

7. The image sensor of claim 1, each pixel circuit comprises an output (vlg_out) connected between the bias transistor (MVB) and the source follower transistor (MSF), and
    wherein at least one of the plurality of pixels circuits is configured such that:
        the second additional transistor (MS2) connects the drain of the bias transistor (MVB) to the drain of the reset transistor (MRST),
        the third additional transistor (MS3) is open,
        the fourth additional transistor (MS4) connects the drain of the reset transistor (MRST) and the gate of the reset transistor (MRST), and
        the row select transistor (MSEL) is closed and the common column output is connected to ground,
    whereby the at least one pixel circuit generates a logarithmic output signal.

8. An image sensor comprising a plurality of pixel circuits each comprising:
    a photodiode connected between ground and a floating diffusion (FD) node,
    a reset transistor (MRST) configured to be connected between a first voltage supply and the floating diffusion (FD) node,
    a source follower transistor (MSF), wherein a drain of the source follower transistor (MSF) is connected to a second voltage supply, a gate of the source follower transistor (MSF) is connected to the floating diffusion (FD) node and a source of the source follower transistor (MSF) is connected to a row select transistor (MSEL), and
    the row select transistor (MSEL) is connected between the source of the source follower transistor (MSF) and a common column output,
    wherein each pixel circuit is configured to provide an output signal corresponding to a light incident on the photodiode; and
    wherein, to configure each pixel circuit to selectively output a linear integration signal or a logarithmic signal, each pixel circuit further comprises:
        a bias transistor (MVB) connected between the second voltage supply and the drain of the source follower transistor (MSF),
        a second additional transistor (MS2) configured to connect a drain of the bias transistor (MVB) to a drain of the reset transistor (MRST), and
        a third additional transistor (MS3) configured to connect the reset transistor (MRST) to the first voltage supply, and
        a fourth additional switch transistor (MS4) configured to connect the drain of the reset transistor (MRST) and a gate of the reset transistor (MRST).

9. The image sensor of claim 8, wherein at least one of the plurality of pixels circuits is configured such that:
the fourth additional switch transistor (MS4) connects the drain of the reset transistor (MRST) and gate of the reset transistor (MRST),
the third additional transistor (MS3) connects the reset transistor (MRST) to the first power supply, and
the second additional transistor (MS2) is open and the row select transistor (MSEL) is closed,
whereby the logarithmic output is made available on the column output.

10. The image sensor of claim 8, wherein each pixel circuit further comprises a transfer gate transistor (MTX) connected between the photodiode and the FD node.

11. The image sensor of claim 8, wherein the image sensor is constructed of multiple semiconductor layers, where each layer is optimised for a function of that layer.

12. The image sensor of claim 8, wherein the image sensor is constructed of multiple semiconductor layers, wherein a second layer of the multiple layers contains the bias transistors (MVB) and the additional transistors (MS2, MS3, MS4), and a first layer of the multiple layers comprises the photodiodes, the reset transistors (MRST), the source follower transistors (MSF), and the row select transistors (MSEL).

13. The image sensor of claim 8, further comprising reconfiguration switches that connect floating diffusion nodes (FD) of a sub-set of adjacent ones of the plurality of pixel circuits.

14. The image sensor of claim 8, wherein each pixel circuit further comprises a bias transistor (MVC) and an output transistor, wherein the bias transistor (MVC) is connected between ground and the source follower transistor (MSF) and a voltage (vc) is connected to a gate of the output transistor.

15. A method for reconfiguring an image sensor comprising a plurality of pixel circuits, the method comprising:
providing a photodiode connected between ground and a floating diffusion (FD) node,
providing a reset transistor (MRST) connected between a first voltage supply and the floating diffusion (FD) node,
providing a source follower transistor (MSF), wherein a drain of the source follower transistor (MSF) is connected to a second voltage supply, a gate of the source follower transistor (MSF) is connected to the floating diffusion (FD) node and a source of the source follower transistor (MSF) is connected to a row select transistor (MSEL), and
connecting the row select transistor (MSEL) between the source of the source follower transistor (MSF) and a common column output,
outputting an output signal corresponding to a light incident on the photodiode;
providing each pixel circuit with an output selection transistor,
configuring each pixel circuit using a corresponding one of the output selection transistors to selectively output a linear integration signal or a logarithmic signal;
connecting a first additional transistor (MVB) between the second voltage supply and the drain of the source follower transistor (MSF), and
providing a second additional transistor (MS2) configured to connect a drain of the first additional transistor (MVB) to a drain of the reset transistor (MRST), and
providing a third additional transistor (MS3) configured to connect the reset transistor (MRST) to the first voltage supply, and
providing a fourth additional transistor (MS4) configured to connect the drain of the reset transistor (MRST) to a gate of the reset transistor (MRST).

16. The method of claim 15, wherein each pixel circuit is configured to generate the logarithmic output signal and the method further comprises:
connecting the drain of the first additional transistor (MVB) to the drain of the reset transistor (MRST) using the second additional transistor (MS2),
maintaining the third additional transistor (MS3) in an open state, and
connecting the drain of the reset transistor (MRST) and the gate of the reset transistor (MRST) using the fourth additional transistor (MS4),
maintaining the row select transistor (MSEL) in a closed state,
connecting the common column output to ground, and
for each pixel circuit connecting an output (vlg_out) between the first additional transistor (MVB) and the source follower transistor (MSF).

17. The method of claim 15, wherein each pixel circuit is configured to generate the logarithmic output signal and the method further comprises:
connecting the drain of the reset transistor (MRST) and the gate of the reset transistor (MRST) using the fourth additional switch transistor (MS4),
connecting the reset transistor (MRST) to the first voltage supply using the third additional transistor (MS3),
maintaining the second additional transistor (MS2) in an open state, and
closing the row select transistor (MSEL),
whereby the logarithmic output is made available on the common column output.

18. The image sensor of claim 1,
wherein the row select transistor (MSEL) is closed and the column output is connected to ground, and
wherein each pixel circuit comprises an output (vlg out) connected between the bias transistor (MVB) and the source follower transistor (MSF).

19. The image sensor of claim 18, wherein at least one additional diode connected transistor is connected in series with the second additional transistor (MS2) and configured to multiply a gain in a logarithmic conversion configuration, or
wherein the at least one additional diode connected transistor is connected in parallel with the third additional transistor (MS3) and configured to multiply the gain in the logarithmic conversion configuration.

20. The image sensor of claim 18, wherein each pixel circuit further comprises a row select transistor (MSEL2) connected between the output (vlg out) and the common column output, and
a fifth additional transistor (MS5) connecting the source follower transistor (MSF) to ground.

21. The image sensor of claim 18, wherein each pixel circuit further comprises a second source follower transistor (MSF2) and a row select transistor (MSEL2) connecting the output (vlg out) to the common column output, and
a fifth additional transistor (MS5) connecting the source follower transistor (MSF) to ground.

22. The image sensor of claim 18, wherein each pixel circuit further comprises a second source follower transistor (MSF2) and a row select transistor (MSEL2) connecting the output (vlg out) to an additional common column output.

\* \* \* \* \*